United States Patent [19]

Silvestre de Ferron

[11] Patent Number: 4,837,742
[45] Date of Patent: Jun. 6, 1989

[54] ELECTRICALLY PROGRAMMABLE ROM

[75] Inventor: Gerard Silvestre de Ferron, Greasque, France

[73] Assignee: Eurotechnique, Rousset, France

[21] Appl. No.: 274,661

[22] PCT Filed: Apr. 4, 1986

[86] PCT No.: PCT/FR86/00115
§ 371 Date: Dec. 5, 1986
§ 102(e) Date: Dec. 5, 1986

[87] PCT Pub. No.: WO 86/06205
PCT Pub. Date: Oct. 23, 1986

Related U.S. Application Data

[63] Continuation of Ser. No. 1,637, Dec. 5, 1986, abandoned.

[30] Foreign Application Priority Data

Apr. 12, 1985 [FR] France .................. 85 05563

[51] Int. Cl.⁴ .................. G11C 11/34; G11C 29/00; G01R 15/12
[52] U.S. Cl. .................. 365/185; 365/189.07; 365/226; 371/21; 324/73 AT; 324/158 R
[58] Field of Search ............... 365/185, 189, 226, 218, 365/103, 230; 324/73, 158; 371/21

[56] References Cited
U.S. PATENT DOCUMENTS

| | | |
|---|---|---|
| 4,253,059 | 2/1981 | Fairchild . |
| 4,460,982 | 4/1984 | Intel . |
| 4,597,060 | 6/1986 | Mitchell et al. ............... 365/185 |
| 4,656,607 | 4/1987 | Hagawara et al. ............. 365/182 |
| 4,672,580 | 6/1987 | Yau et al. ...................... 365/49 |
| 4,709,350 | 11/1987 | Nakagome et al. ............ 365/184 |
| 4,727,515 | 2/1988 | Hsu ............................... 365/185 |

OTHER PUBLICATIONS

Patents Abstracts of Japan, vol. 1, No. 159, Dec. 16, 1977 p. 859E77 & JP A, 52101934 (Tokyo Shibaura Denki K.K.) Aug. 26, 1977.
Patent Abstracts of Japan, vol. 5, No. 107 (P-70) (779) Jul. 11, 1981 & JP A, 5651090 (Tokio Shibaura Denki K.K.) May 8, 1981 See Abstract.
IEEE Transactions on Electron Devices, vol. ED-27, No. 7, Jul. 1980 IEEE New York (U.S.) B. Gerber et al: "Low-Voltage Single Supply CMOS Electrically Erasable Read-Only Memory", pp. 1211-1216 See p. 1214, FIG. 8.

Primary Examiner—Terrell W. Fears
Assistant Examiner—Melissa J. Koval
Attorney, Agent, or Firm—Oblon, Spivak, McClelland, Maier & Neustadt

[57] ABSTRACT

An electrically programmable ROM is provided for avoiding frauds by producing, internally in the memory, the different potentials which it uses for verifying the memory points chosen. The verification of writing of information in a point is obtained by subjecting this point to a calibrated selection voltage, to which an external operator cannot have access. This calibrated voltage is produced by a multiplying generator. This latter feeds into one or more calibrators for producing all the useful voltages. Reading and writing orders are then given to a switching circuit which causes the corresponding application of these calibrated voltages. An external operator cannot enter in the memory level falsified signals for modifying the meaning of the contents of the recorded information.

8 Claims, 2 Drawing Sheets

ELECTRICALLY PROGRAMMABLE ROM

This application is a continuation of application Ser. No. 001,637, filed on Dec. 5, 1986, now abandoned.

BACKGROUND OF THE INVENTION

1. Field of the Invention

The present invention relates to an electrically programmable ROM for example EPROM or EEPROM. These memories have the advantage that they may be programmed by the user. Moreover, in some cases, they may even be cleared then rewritten a certain number of times if need be. The data storage element thereof is a floating gate transistor. This transistor may have two states. In a first state, no charge is trapped on the floating gate. A conduction channel may be installed between source and drain of this transistor. This latter may then conduct; it behaves like a closed switch. In a second state, electrons have been trapped on the floating gate. They prevent the creation of a conduction channel in the substrate between source and drain. The transistor is disabled and behaves like an open switch. The advantage of this type of storage element resides in the non volatility of the recorded data. The electric charges trapped in the floating gate only leak away slowly. The loss of charge in the floating gate determines the retention time of a memory point. At the end of this time, the stored data is no longer readable. This retention time is generally of the order of 5 to 10 years, it depends on the amplitude and on the duration of the voltage applied during programming. Typical programming values are 21 volts and 50 milliseconds.

The enabled or disabled state of the transistor is measured by feeding a selection pulse to its control gate. In the enabled state, no charge is trapped on the floating gate and the selection voltage applied causes saturation of the transistor. From the practical point of view, the tranistor is connected by a first main electrode to a bit line, voltage-biased by a generator; by its other main electrode it is connected to ground. The bit line is also connected to a current sensor: this sensor measures the current delivered into the line by the generator. When the transistor is enabled, it short circuits the generator and the sensor detects a current drop. This current drop is used subsequently as representative of the data corresponding to the programming state of the transistor concerned. In a second case, when the memory point is programmed, charges are trapped in the floating gate of the transistor. The selection voltage applied to the control gate is of opposite direction to the potential barrier created, in the conduction channel, by the charges stored in the floating gate. But it is then insufficient to modify the conduction of this channel: the transistor remains disabled. Consequently, the sensor at the end of the bit line does not perceive a current variation. At the time of selection of the memory point considered, it thus detects a state which is the reverse of the first case.

One of the most accessible fields in the technology of electrically programmable ROM's is that of memory cards. A memory card is a card, for example in the format of a banking credit card: an electronic integrated circuit is set in this card, and electric connection terminals are accessible on the surface so that operations may be carried out with the card in a terminal unit.

The fundamental problem of memory cards is that of frauds. Endeavors are made to prevent holders from falsifying the information contained in the memories of the cards. A first risk to avoid is that of the introduction, under poor conditions, of crictical information in the memory. Thus, in a first step, this information is introduced through series of electric pulses applied to the terminals of the memory. To be sure that the information has been correctly introduced, the contents of the memory is then checked by applying electric checking pulses to the access terminals.

2. Description of the Prior Art

But the effective retention power of the information stored in the memory points cannot be checked. Frauders are in fact suspected of tampering with the access terminals, for example by covering them with a minute layer of graphite which forms a resistance. Thus, programming of the data in the memory cannot be provided at a sufficient level for the retention of the information to correspond to a desired duration. It might be thought that such a fraud may be detected by feeding adequate electric pulses to the access checking terminal during checking. But frauders are also suspected of also tampering with the access checking terminals (probably in the same way). In other words, it is thought that a clever frauder could modify the programming conditions of the memory even if such programming is provided by the organization issuing the memory cards in question. Checking would then prove just as illusory since it would be practiced under the same conditions.

The present invention proposes an efficient solution to this problem: the potentials of the pulses used during checking are not, in the invention, potentials applied externally to the memory, but rather potentials produced therein. Fixing the useful potential level during programming irremediably determines the retention time of the information which it contains. With the potential level used by the checking pulses fixed intrinsically, the reality of the information stored in the memory may be checked.

This further means that, in accordance with the invention, if the information is programmed and if the programmed information is checked, it is done well or it is not done at all. In the state of the technique criticized, information could be programmed, then badly checked, so that for some time there is a false semblance of integrity of the information stored. After a certain time, the information would become illegible: in fact the ones would becomes zeros. This would singularly modify the information stored, especially if it was supposed to represent a bank account balance.

SUMMARY OF THE INVENTION

The invention provides an electrically programmable ROM of the memory point type with floating gate transistor, and accessible through a matrix of lines and columns, including means for applying to these lines and columns potentials representative of information to be recorded at the points or representative of controls for reading the recorded information. Which memory further includes integrated means for applying to these lines and columns checking potentials whose levels are fixed intrinsically.

BRIEF DESCRIPTION OF THE DRAWINGS

The invention will be better understood from reading the following description with reference to the accompanying Figures. In these Figures the same references designate the same elements. They are given solely by way of indication and are in no wise limitative of the invention. They show.

DESCRIPTION OF THE PREFERRED EMBODIMENT OF THE INVENTION

Figure 1A:
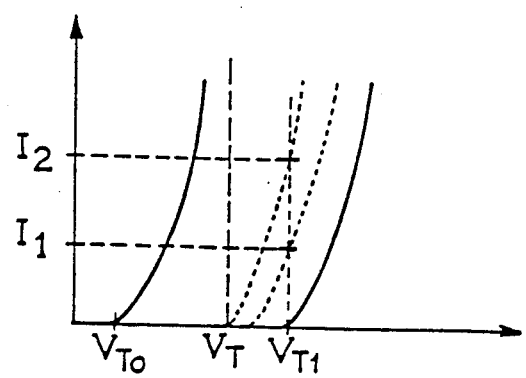
FIGS. 1a and 1b an electric operating diagram of a memory point with a floating gate transistor.
Figure 1B:
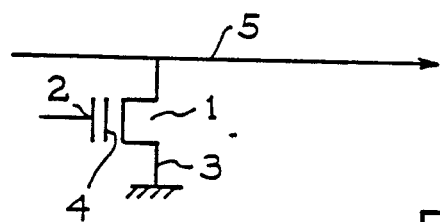

FIG. 1a shows the diagram of the operating characteristic of a floating gate transistor. This can be seen furthermore in FIG. 1b. The current flowing through transistor 1 is shown as ordinates in the diagram. The voltage applied between the reading gate 2 and a main terminal 3 of the transistor is plotted as abscissa. FIG. 1a comprises two curves. A first curve shows that a current begins to flow from a voltage $V_{To}$, and a second curve shows that a current begins to flow from a voltage $V_{Tl}$. The first corresponds to an unprogrammed floating gate transistor (in fact programmed to one): no charge is trapped on the floating gate 4. The potential barrier of this transistor is equal to $V_{To}$. When a voltage pulse (shown with a broken line) whose value is equal to $V_T$ is applied to this transistor, to its gate 2, this transistor is enabled: it short circuits the bit line 5 to ground. On the other hand, the right hand curve corresponds to a transistor having charges trapped on its floating gate, so that its potential barrier is translated from $V_{To}$ to $V_{Tl}$. It is programmed to zero. Receiving in addition a value selection pulse $V_T$, this transistor continues to be disabled: no current is short circuited from the bit line 5 to ground. In an intermediate position between these two curves are shown, with dotted lines, two other curves corresponding to transistors programmed to zero but whose floating gate comprises less and less trapped charges. The trapped charges are however still sufficiently numerous for the potential barrier of these transistors to be greater than the selection voltage $V_T$ which serves for normal reading of the cells. If these transistors are subjected to higher selection voltages, for example equal to $V_{Tl}$, they let current respectively I1 and I2 pass to ground showing, by the size of these currents, their retention capacity defect. They are correctly programmed (for a voltage $V_T$) but their retention capacity is poor. The fraud suspected consists precisely in modifying the programming voltages so that the number of trapped charges is just insufficient. It also consists in modifying the checking voltage $V_{Tl}$ (by reducing it substantially for example) so that it does not allow currents such as I1 or I2 to appear which inform about the retention capacity defect. After a certain time, and once the added graphite layers have been removed, a one would quite naturally be read where before one might assert that a zero had been written.

Figure 2:
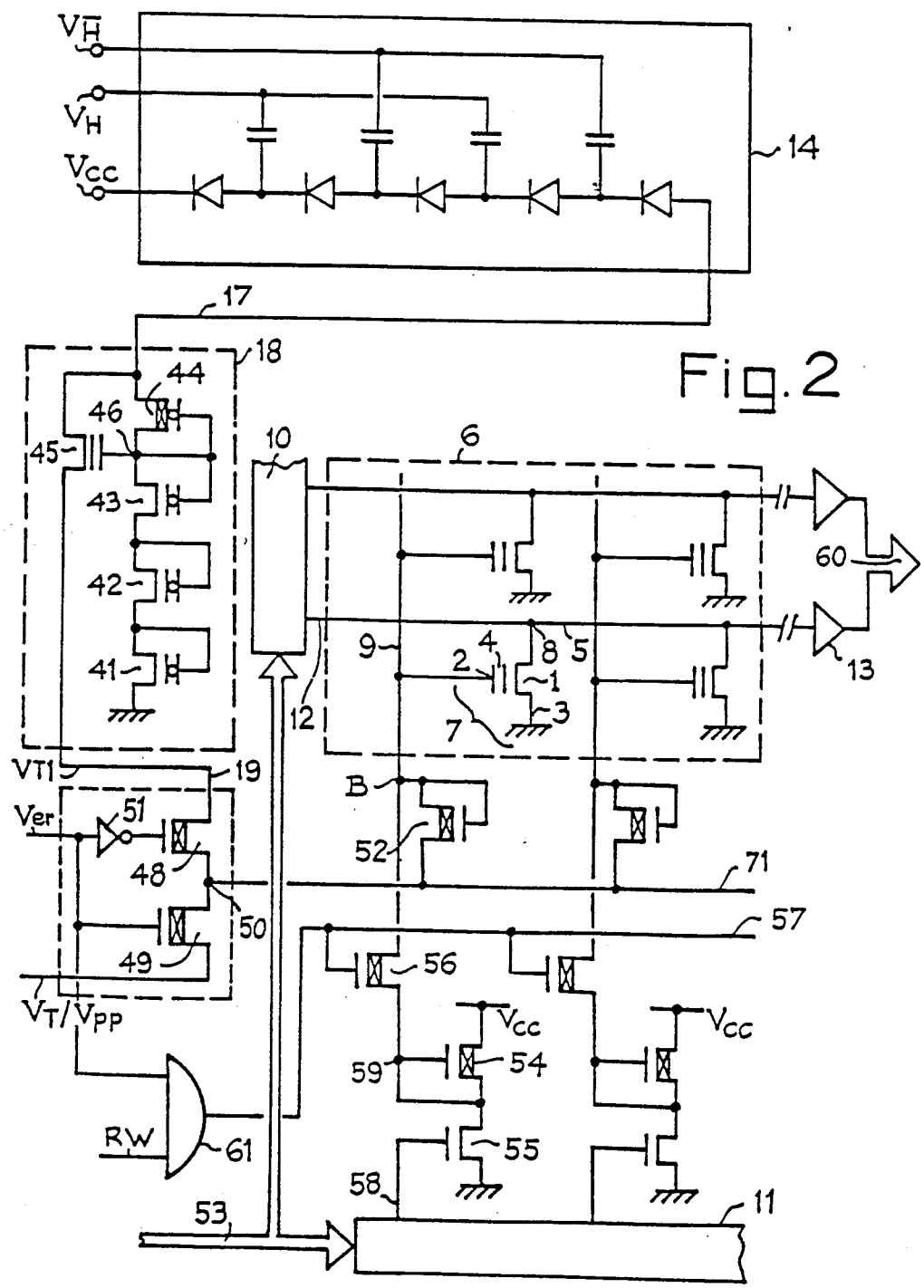
FIG. 2, a memory in accordance with the invention.

To overcome these attempts at fraud, in accordance with the invention, it has quite simply been decided to produce the checking voltages $V_{Tl}$ inside the memory. The reading $V_T$ and programming $V_{pp}$ voltages may also be produced therein. FIG. 2 shows an electrically programmable memory 6. It is of the memory point type 7 with transistor 1 with floating gate 4. The transistors 1 have two main electrodes respectively 3 and 8 and a control gate 2. The first main electrode may be connected to ground whereas the other is connected to a line 5 called bit line. The control gate 2 is connected to another connection 9 called word line. The bit lines and word lines are arranged in lines and columns so as to define a matrix including the memory points. This memory includes means essentially a line de coder 10 and a column decoder 11, for applying to the lines and columns potentials representative of information to be recorded in the points or representative of a control for reading the information recorded at these points. For example, for reading the memory point 7 a current produced by a corresponding output 12 of decoder 10 is caused to flow in the bit line 5. By means of the column decoder 11, a control pulse is sent over the word line 9. The transistor 1 is enabled or remains disabled depending on whether charges have or have not been first of all trapped on the floating gate 4. A current sensor 13 connected to one end of the bit line 5 detects the variation, or absence of variation, of the current. It deduces therefrom that the memory point was programmed to one or to zero respectively.

An important feature of the invention resides in the fact that the potential applied to gate 2 is not produced by the decoder 11 but is produced intrinsically by the memory itself. For this, the memory has an oscillating circuit one output of which is connected to a rectifier. But preferably it will include an integrated high voltage multiplying generator 14 of Schenkel type. These Schenkel generators are closely related operationally to ideal voltage multipliers. They have cell arrangements of diodes and capacities whose terminals are switched by clock pulses $V_H$ and $V_{\overline{H}}$. They are fed by the general power supply VCC of the memory. The DC potential thus produced may be applied to the control gate 2 depending on the selection orders elaborated by the decoder 11. To avoid any accidental or ill intentioned fluctuations of the potential available at the output 17 of generator 14, this potential may be calibrated in the calibrator 18. Thus, the output 19 of calibrator 18 may produce constant and calibrated voltages whatever the power supply conditions at $V_{CC}$ of the generator 14. Any attempt at fraud consisting moreover in altering the general power of the memory are also thwarted. It is possible to produce in this way all the useful potentials: the potential $V_{pp}$ used for programming, especially the potential $V_{Tl}$ used for checking the programming or even the potential $V_T$ used for reading the information recorded at the points In a preferred embodiment the programming potential is supplied externally. This is not inconvenient since any attempts at fraudulently changing this potential may be easily discovered by using an untouchable checking potential. From the practical point of view, the production of potential $V_{pp}$ could be obtained by connecting another calibrator in parallel across the calibrator 18: its input would be connected to connection 17 and its output would deliver the potential $V_{pp}$.

In the calibrator 18, the voltage produced is limited. In a preferred embodiment, this calibrator has a certain number of transistors, in the example, three, of the same technology (FRAMOS) as the transistor used for storing information at each memory point. Here, these are the transistors 41 to 43. These transistors 41 to 43 have the characteristics that their floating gate is short circuited to their control gate. The control gates of each of these transistors are connected to their drain. Each forms then a diode and causes a calibrated potential drop $V_{To}$.

This cascade of transistors 41 to 43 is fed by a depleted transistor 44, biased to the disabling limit with its gate connected to the source electrode. An additional transistor 45, made from the same technology as transistors 1 and whose floating gate is also short circuited to the control gate, receives at its gate the middle point 46 of the circuit comprising the transistor 44 and the cascade of transistors 41 to 43. The potential imposed on the grid of transistor 45 is therefore calibrated. At a first main electrode this transistor 45 receives the rectified signal coming from generator 14. It therefore delivers at its second main electrode a calibrated voltage signal $V_{Tl}$ In fact, the voltage at its output is equal to the voltage applied to its gate reduced by the characteristic potential drop between source and gate. The transistor 44 being depleted, its conduction threshold is zero. A non depleted transistor whose gate is brought to the source potential would remain disabled. The depleted transistors in FIG. 2 comprise a mark in the form of a cross in the drawings.

It was seen above that the memory points could be submitted to three types of situation: writing, reading and checking. In the invention, and although that does not form an obligation, it has been decided to differentiate these situations by two different orders: a first order Ver (for verification) and a second order RW (for read-write). In the convention chosen, for a writing operation in the memory Ver is equal to 1 and RW is equal to zero; for reading Ver will be equal to 1 and RW also; and for verification Ver is equal to zero and RW is equal to 1. The order Ver as well as the voltages $V_{pp}$ or $V_T$ and $V_{Tl}$ are introduced into a switch 47. This switch comprises two depleted transistors 48 and 49 in cascade. A first main electrode of transistor 48 is connected to the voltage source $V_{Tl}$ (output 19 of calibrator 18), its second main electrode is connected at a middle point 50 to the first main electrode of transistor 49. The second main electrode of 49 is connected to the voltage source $V_{pp}$. The gate of transistor 49 receives the order Ver. The gate of transistor 48 receives this order Ver after it has passed through an inverter 51. A connection 71 connected to the middle point 50 is connected by depleted transistors such as 52 to each of the word lines 9. The depleted transistor 52 whose gate is connected to one of its main terminals is equivalent to a resistance.

The addresses of the memory points to be selected transit through an address bus 53 and are translated respectively by the decoders 10 and 11. For the chosen line, the decoder 10 produces a supply voltage . For the column located, a chosen output 58 of decoder 11 produces a zero state. The non chosen outputs are bought to an electric state 1 at the output of decoder 11. Facing each output of decoder 11 is provided a cascade circuit of two transistors 54 and 55 between the supply voltage $V_{cc}$ and ground. Transistor 54 is a depleted transistor. The output 58 of the decoder controls the gate of transistor 55. The middle point 59 of the two transistors is connected to the gate of transistor 54 as well as to a main electrode of a depleted transistor 56. The other main electrode of the depleted transistor 56 is connected to the word line 9. The control gate of transistor 56 receives the reading-writing order RW over a connection 57.

For each of the three situations we will now see what happens to the memory point depending on whether the address of the memory point chosen is good or not. In a first operation, it is desired to write the memory point 7, (Ver equal to 1 and RW equal to zero). The output 58 considered of decoder 11 is then brought to zero. Transistor is disabled and the result is that the middle point 59 of transistors 54, 55 is brought to $V_{CC}$. Since RW is equal to zero transistor 56 is disabled. This transistor 56 is disabled because, as will be seen further on, the voltage applied to its other terminal is greater than its disabling threshold voltage. Consequently, the voltage on the word line 9 will be imposed by the voltage available at connection 71. In fact, transistor 52, which behaves like a resistance, does not here cause a voltage drop since the current which flows through it can only go into the gate 2 of transistor 1: that is to say that it is very small. The order Ver to one short-circuits transistor 49 and opens transistor 48. Consequently, the voltage $V_{pp}$ is applied to the middle point 50 connected to connection 71. The result is that the voltage $V_{pp}$ is fed to the gate 2 of the transistor, that is precisely what is desired. At this time, an adequate current pulse is fed to the output 12 of decoder 10 and transistor 1 thus selected is programmed (to zero or to one depending on the pulse available at 12).

For the transistors 1 which have not been selected: that is to say those for which the output connection of decoder 11 delivers a state 1, their transistor 55 is short circuited, and their middle point 59 between transistor 54 and 55 is therefore brought to zero. Since the order RW available at connection 57 is equal to zero, but since the transistors 56 are depleted, they are nevertheless enabled. The result is that the voltage $V_{pp}$ available at connection 71 is fed into the resistances formed by the depleted transistors at 52. These latter are now connected to ground through their second main electrode: the other word lines are therefore not brought to the programming potential $V_{pp}$.

For the reading operation, it is assumed that the orders Ver and RW are equal to 1. Since this is a simple reading operation., it is assumed that the terminals which will read the contents of these ROM's will comprise a connection such that they will apply a reading voltage ($V_T$) instead of the preceding application of the programming voltage $V_{pp}$. Since the order Ver is identical to the preceding case it is therefore this new reading voltage ($V_t$) which is applied to the connection 71. For the output 58 corresponding to the memory point 7 chosen, the electric state is equal to zero. The potential $V_{cc}$ is then brought to the middle point 59. The depleted transistor 56 then receives at its gate an order RW at state 1 (namely $V_{cc}$), at a first main electrode the voltage $V_{cc}$ coming from the middle point 59 and at the other mun electrode a voltage $V_T$ coming from the connection 71 through the depleted transistor 52. If $V_T$ is different from $V_{cc}$, the area of transistor 56 is calculated so that it presents a resistance such that the voltage $V_T$ is applied to the gate 2 of transistor 1. The role of transistors 56 is to prevent the formation of a path between a very high writing, reading or verification potential and the normal power supply of memory $V_{cc}$ (often of the order of 5 volts). This is why they are here at the limit of conduction.

This reading voltage allows the state of the charges trapped in the floating gate 4 to be read. A current generator then feeds into the bit line 5. Sensor 13 detects, or does not detect, a current drop related to the enabling of transistor 1. The information which it collects is then fed over a data bus 60. For the word lines not selected by decoder 11, the middle points 59 of transistors 54 and 55 are brought to the ground potential. Transistors 56 conduct: they receive RW at one on their gates. The word lines not selected are brought to ground potential: the transistors of the memory points which are assigned to them are not energized.

The verification operation requires an order Ver at a zero state, and an order RW at a one state. An AND gate 61 which receives these two orders then delivers a zero state to connection 57. The change of value of order Ver with respect to the preceding case causes the switch 47 to switch. The voltage $V_{TI}$ is now available at the middle point 50 connected to connection 51. Everything happens as for writing, except that $V_{TI}$ replaces $V_{pp}$. If the memory points 7 were programmed without a trapped charge, the current in sensor 13 must vary: this is normal. On the other hand, if transistor 1 was programmed with trapped charges, even when applying $V_{TI}$ thereto, the current in sensor 13 must not vary. If the current in sensor 13 varies, it is because an insufficient number of charges have been trapped. This reading information may be used contrary to the expected information for preventing any subsequent use of the memory.

What is claimed is:

1. An EEPROM having a plurality of memory cells with each employing at least one floating gate transistor and wherein each memory cell is accessible through a matrix of bit lines and word lines, comprising:
   integrated circuit means internal to said EEPROM for applying to these bit lines and word lines potentials representative of information to be recorded in the cells or representative of control signals for reading the recorded information:
   further comprising as part of said integrated circuit means
   verification means for applying to those bit lines and word lines connected to each cell a verification potential whose level is fixed intrinsically to said EEPROM, wherein said integrated circuit means further includes means for producing a calibrated potential, said means for producing a calibrated potential comprising means for amplifying a supply potential and means for reducing an amplified potential, wherein the output of said amplifying means is coupled to the input of said reducing means for reducing said supply potential being amplified.

2. The memory as claimed in claim 1 wherein said verification means for applying potentials comprises:
   bit lines, connected first to the outputs of a line decoder, second to information sensors and third to main connections of floating gate transistors; and
   columns, called word lines, connected first to the outputs of a column decoder, second to the control gates of the floating gate transistors and third to resistive circuits for applying reading and writing potentials.

3. The memory as claimed in claims 1 or 2 wherein said verification means comprises:
   a multiplying generator.

4. The memory as claimed in any one of claims 1, 2 or 3, wherein said verification means further comprises:
   calibration means having a transistor of the same technology as that of the memory cell, receiving at a first main electrode the potential produced by said integrated means, at its control gate a calibrated voltage produced by calibration means and supplying through its second main electrode the desired calibrated potential.

5. The memory as claimed in claim 4, wherein said calibration means comprises:
   a cascade arrangement of transistors made according to a technology identical to that of the transistor of the memory cell, these transistors having a saturation current flowing therethrough.

6. The memory as claimed in claim 5, further comprising:
   means for switching the potentials to be applied.

7. The memory as claimed in claim 6, further comprising:
   selection means for applying different potentials.

8. The memory as claimed in claim 2, wherein said word lines are connected to the outputs of the column decoder through a validation circuit receiving both the column addresses of points and a validation order for draining the currents applied by the resistive circuit.

* * * * *